United States Patent [19]
Glehr

[11] Patent Number: 5,796,180
[45] Date of Patent: Aug. 18, 1998

[54] DEVICE FOR TRANSMITTING DATA OR ENERGY

[75] Inventor: Manfred Glehr, Neutraubling, Germany

[73] Assignee: Siemens Aktiengesellschaft, Munich, Germany

[21] Appl. No.: 787,649

[22] Filed: Jan. 23, 1997

[51] Int. Cl.[6] .................................................. G01S 13/74
[52] U.S. Cl. ................. 307/10.5; 307/10.4; 340/825.34; 340/825.54; 340/825.69; 340/825.72; 701/2; 342/52
[58] Field of Search ..................... 307/9.1–10.8; 180/287, 167; 340/425.5, 426, 435, 825.31, 825.34, 825.36, 825.44, 825.54, 825.69, 825.72; 364/423.098, 423.099, 424.045; 235/128, 380, 382, 382.5; 380/3; 342/42, 51, 52, 53

[56] References Cited

U.S. PATENT DOCUMENTS 3,613,060  10/1971  Legrand ................. 340/825.54
5,153,583  10/1992  Murdoch ................. 340/825.54
5,287,112  2/1994  Schuermann ................. 342/42

FOREIGN PATENT DOCUMENTS 2293200  3/1996  United Kingdom .

*Primary Examiner*—Brian Sircus
*Assistant Examiner*—Peter Ganjian
*Attorney, Agent, or Firm*—Herbert L. Lerner; Laurence A. Greenberg

[57] ABSTRACT

A device for transmitting data or energy supply from or to a transponder, especially for an anti-theft system in a motor vehicle, includes an antenna oscillating circuit which is induced to oscillate by an exciter variable. The oscillation is transmitted by transformer coupling to a transponder oscillating circuit. In order to make the transmission of energy or data as effective as possible, the current or the voltage in the antenna oscillating circuit is measured and compared with a desired variable. Upon a deviation, a correction value is generated by which the exciter current is increased or the resonant frequency is adapted to the exciter frequency as a consequence of the addition of an impedance to the antenna oscillating circuit.

8 Claims, 3 Drawing Sheets

DEVICE FOR TRANSMITTING DATA OR ENERGY

BACKGROUND OF THE INVENTION

FIELD OF THE INVENTION

The invention relates to a device for transmitting data or energy. Such a device can be used in particular for an anti-theft system for a motor vehicle, in which encoded information is sent from a key and to a lock, and vice versa.

One device which is known from German Patent DE 44 30 360 C1, corresponding to Published UK patent Application GB 2 293 200, has a stationary transceiver that includes an oscillating circuit. In the transceiver, an oscillation is compelled by an exciter variable whose energy is transmitted to a transponder. The transponder likewise has an oscillating circuit, by which the energy is received and encoded data are transmitted back to the transceiver.

If success is initially not attained in that known device the first time that the encoded data are acquired, then the oscillating circuit of the transceiver is "mistuned". To that end, the resonant frequency of the oscillating circuit or its exciter frequency is changed. If the oscillating circuit is mistuned as a consequence of component tolerances, that mistuning is preserved even when the transceiver is used in an anti-theft system. As a result, every transmission operation then has to be performed at least twice.

SUMMARY OF THE INVENTION

It is accordingly an object of the invention to provide a device for transmitting data or energy, which overcomes the hereinafore-mentioned disadvantages of the heretofore-known devices of this general type and in which the energy or data are transmitted as effectively as possible.

With the foregoing and other objects in view there is provided, in accordance with the invention, a device for transmitting data or energy supply from or to a transponder, especially for an anti-theft system in a motor vehicle, comprising a stationary transceiver including a first oscillating circuit having an antenna in the form of a first coil, a first capacitor, and a resonant frequency determined by the antenna and the first capacitor; a portable transponder including a second oscillating circuit having a second coil and a second capacitor; an exciter unit oscillating at an oscillator frequency and supplying an output variable used as an exciter variable with an exciter frequency for compelling an oscillation of the first oscillating circuit; and an evaluation unit for measuring current and/or voltage in the first oscillating circuit, the evaluation unit generating a correction value upon a deviation of the current or the voltage from a desired value and then with its aid correcting the first oscillating circuit upon all transmissions between the transceiver and the transponder for causing the most effective possible transmission between the transceiver and the transponder to take place.

In accordance with another feature of the invention, the current and/or the voltage in the first oscillating circuit is measured in accordance with amount and phase, and the correction value is ascertained as a function thereof.

In accordance with a further feature of the invention, the resonant frequency of the first oscillating circuit is varied as a function of the correction value by adding or subtracting at least one serial or parallel inductance and/or at least one serial or parallel capacitance, to or from the antenna or the first capacitor.

In accordance with an added feature of the invention, the exciter unit has a driver stage controlled as a function of the correction value, for increasing or decreasing the current in the first oscillating circuit; the exciter unit has a memory for storing the correction value; and the memory is connected to the driver stage.

In accordance with an additional feature of the invention, the current in the first oscillating circuit is varied by the correction value only within a predetermined tolerance width.

In accordance with yet another feature of the invention, the first oscillating circuit is connected to the second oscillating circuit through the antenna and the second coil, if the transponder is located in the vicinity of the transceiver.

In accordance with a concomitant feature of the invention, the transponder has code information generating a modulated oscillation of the first oscillating circuit as a consequence of an inductive coupling; the evaluation unit detects the modulated oscillation; the code information is demodulated from the modulated oscillation; the detected code information is compared with desired code information; and a release signal for releasing a security device is generated if the detected code information and the desired code information agree.

Advantageously, this correction value is stored in memory and used in later inductive transmissions of data or energy in an anti-theft system.

Other features which are considered as characteristic for the invention are set forth in the appended claims.

Although the invention is illustrated and described herein as embodied in a device for transmitting data or energy, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
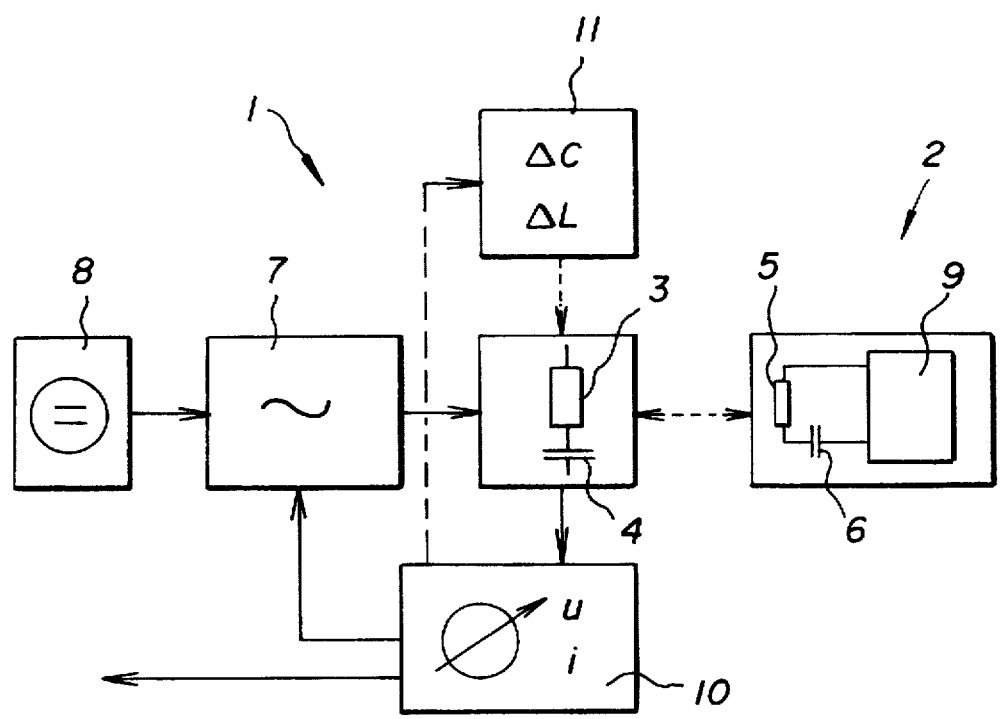
FIG. 1 is a schematic and block circuit diagram of a device of the invention.

Referring now to the figures of the drawings in detail and first, particularly, to FIG. 1 thereof, there is seen a device for transmitting data or energy according to the invention, which has a stationary transceiver 1 that cooperates with a portable transponder 2 through a transformer coupling, if the transponder 2 is located in the vicinity of the transceiver 1. The transceiver 1 initially transmits energy to the transponder 2. Code information is stored in the transponder 2 and transmitted back to the transceiver 1 (energy transmission and transmission of data in return are represented by a double-headed arrow drawn in dashed lines).

In order to transmit energy or data, the transceiver 1 has an antenna 3 in the form of a coil, which together with a capacitor 4 forms a first oscillating circuit (referred to below as an antenna oscillating circuit 3, 4). The antenna 3 is coupled to a coil 5 of the transponder 2 inductively or by transformer coupling. The coil 5 of the transponder 2, together with a capacitor 6 connected in serial or parallel therewith, forms a second oscillating circuit (referred to below as a transponder oscillating circuit 5, 6).

The antenna oscillating circuit 3, 4 is supplied from a generator or an oscillator 7 with an alternating voltage or alternating current at the cadence of an exciter frequency $f_E$, as soon as a supply unit 8 of the oscillator 7 is turned on. As a result, the antenna oscillating circuit 3, 4 is excited to oscillate at the exciter frequency $f_E$. The field excited by the antenna 3 induces a voltage in the coil 5 of the transponder 2, if the transponder 2 is located in the vicinity of the transceiver 1.

The transponder oscillating circuit 5, 6 is in turn excited to oscillate by the oscillation of the antenna oscillating circuit 3, 4. The transponder oscillating circuit 5, 6 can be loaded at the rhythm of the code information by a connected transponder IC 9, in which code information is stored in memory. As a result, the antenna oscillating circuit 3, 4 is loaded or modulated at the rhythm of the code information, because of the transformer coupling.

The antenna oscillating circuit 3, 4 is compelled by the oscillator 7, which has an exciter variable, to oscillate at the exciter frequency $f_E$. The output voltage or output current of the oscillator 7 is used as the exciter variable. The oscillator 7 oscillates at an oscillator frequency $f_O$. A non-illustrated frequency divider, which divides the oscillator frequency $f_O$ down to the desired exciter frequency $f_E$, may also be provided between the oscillator 7 and the antenna oscillating circuit 3, 4. A stationary-compelled oscillation of the antenna oscillating circuit 3, 4 arises through the use of the exciter variable, and this circuit then oscillates at the exciter frequency $f_E$.

Each oscillating circuit has a natural frequency, which is also called a resonant frequency $f_R$, that is determined by the components of the oscillating circuit, or in other words by the inductance of the antenna 3 and the capacitance of the capacitor 4 in the antenna oscillating circuit 3, 4. The exciter current flowing through the antenna 3 is highest when the oscillating circuit is excited with an exciter frequency $f_E$ that is equal to the resonant frequency $f_R$ (see the curve in solid lines in FIG. 2). As a result, the magnetic field that is generated by a current I flowing through the antenna 3 is the highest. Therefore, the most energy is transmitted to the transponder 2. The maximum amplitude of the current I depends on the quality of the oscillating circuit. If the quality is high, the amplitude of the current I is high, and at lesser quality, the amplitude of the current I is lower.

Figure 2:
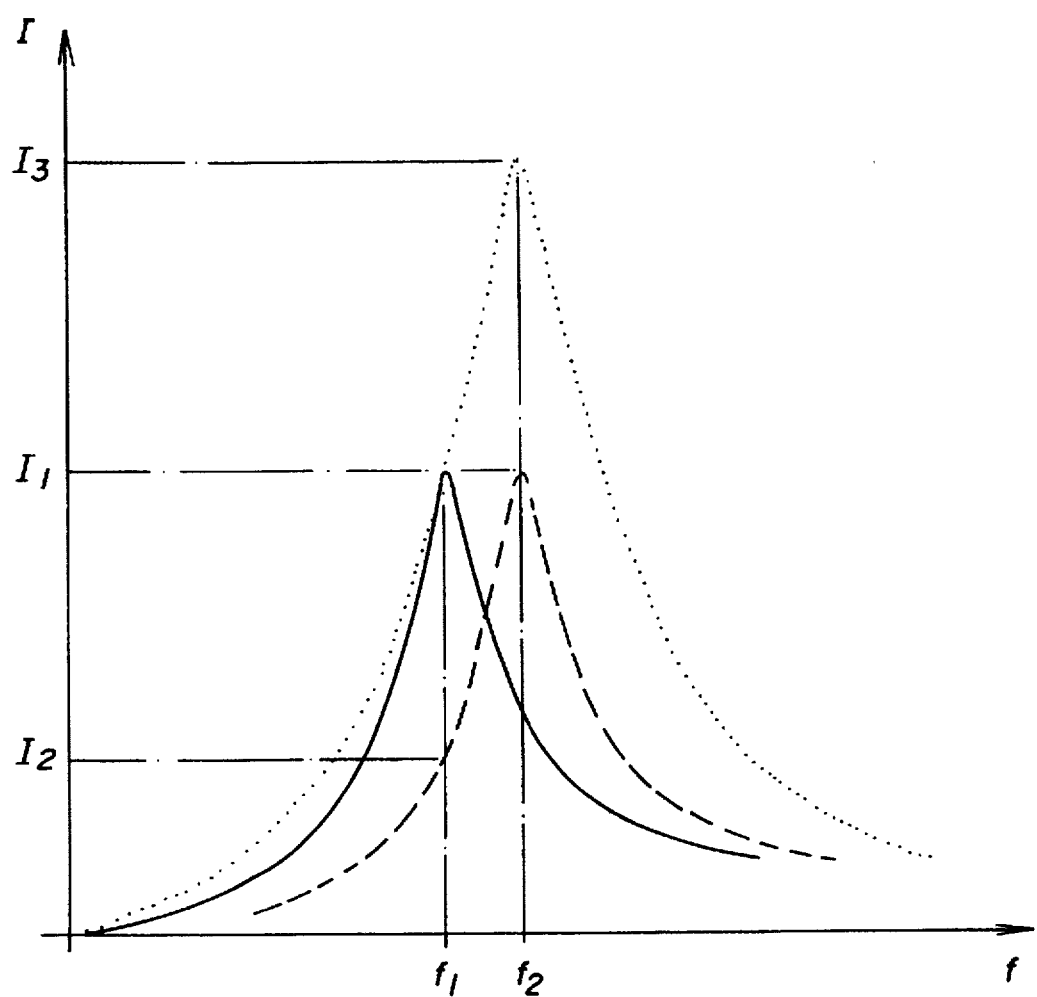
FIG. 2 is a graph of a resonance curve of an oscillating circuit of the device of FIG. 1.

The power balance is illustrated in terms of a resonance curve in FIG. 2, in which the frequency f is plotted on the abscissa (X axis) and the amplitude of the current I through the antenna 3 is plotted on the ordinate (Y axis).

The exciter frequency $f_E$ can be kept quite constant through the use of a regulated oscillator 7, while the resonant frequency $f_R$ is dependent on the components and their tolerances. If the exciter frequency $f_E$ is equal to a frequency $f_1$ and at the same time the resonant frequency $f_R$ is equal to the frequency $f_1$, then the current I flowing through the antenna 3 is highest, with a maximum amplitude of $I_1$. If the resonant frequency $f_R$ (which equals a frequency $f_2$) deviates from the exciter frequency $f_E$ (shown by a resonance curve shown in dashed lines in FIG. 2), then the antenna oscillating circuit 3, 4 is no longer optimally excited, and only a current with an amplitude $I_2$ flows through the antenna 3. The magnetic field which is thus generated may then be too slight to transmit data or energy.

In the production of the transceiver 1, deviations from desired values of the inductance of the antenna 3 and the capacitance of the capacitor 4 can occur as a consequence of component tolerances. The resonant frequency $f_R$ of the antenna oscillating circuit 3, 4 thus varies relative to the constant exciter frequency $f_E$. If the device of the invention is operated under such conditions, then the maximum energy is no longer transmitted to the transponder 2, and the data received from it can likewise only be received at very low amplitude.

After the transceiver 1 has been manufactured, it must first be ascertained whether or not the resonant frequency $f_R$ deviates from the exciter frequency $f_E$ by more than a particular specified amount. To that end, the amplitude of the current I through the antenna 3, or the voltage U at the capacitor 4, is measured with the aid of a measuring device 10. The measured amplitude is compared with a previously fixed and memorized desired value. If the deviation is too great, a correction value is generated and stored in memory in the measuring device 10. The antenna oscillating circuit 3, 4 is then corrected as a function of the correction value upon all transmissions between the transceiver 1 and the transponder 2, so that the most effective possible transmission between the transceiver 1 and transponder 2 will take place.

The antenna oscillating circuit 3, 4 can be varied in two different ways as a function of the correction value for the sake of the most effective possible transmission of energy and data. First, the resonant frequency $f_R$ of the antenna oscillating circuit 3, 4 can be approximated to the exciter frequency $f_E$, and second, the current I through the antenna 3, or in other words the exciter current, can be increased.

First, the variation in the resonant frequency $f_R$ will be considered (the course illustrated by dashed lines in FIG. 1). By measuring the current I through the antenna 3, its maximum amplitude is first compared with a desired amplitude. If the current deviates too much from a desired current, then the resonant frequency $f_R$ deviates from a desired resonant frequency.

It can be ascertained by measuring the phase of the current and voltage whether the antenna oscillating circuit 3, 4 is inductively or capacitively mistuned. This is because in an inductive mistuning, the current I through the antenna 3 lags behind the voltage U by a phase angle $\phi$, and in a capacitive mistuning, the current I leads ahead of the voltage U by the phase angle $\phi$. The magnitude of the mistuning is known from the measured amplitude of the current I. The direction of the mistuning is known by the comparison of the phases of the current I and voltage U. The amplitude I and the phase angle $\phi$ then define the correction value.

Next, a capacitance $\Delta C$ or an inductance $\Delta L$ is added to the antenna oscillating circuit 3, 4, or subtracted from it, as a function of the correction value through a capacitive and/or inductive network 11. As a result, the resonant frequency $f_R$ of the antenna oscillating circuit 3, 4 changes. The capacitance $\Delta C$ and the inductance $\Delta L$ are defined in such a way that the resonant frequency $f_R$ approximates the exciter frequency $f_E$, due to the addition or subtraction of the capacitance $\Delta C$ and/or the inductance $\Delta L$. This corresponds in FIG. 2 to a shift in the dashed-line resonance curve toward the left, to the resonance curve shown in solid lines. Thus at the exciter frequency $f_E$, a current I having an amplitude which is approximated to the desired amplitude $I_1$, flows through the antenna 3.

The addition or subtraction of the capacitance ΔC and/or the inductance ΔL is carried out only once and for all after the manufacture of the transceiver 1. These corrections, that is the addition or subtraction of the capacitance ΔC and/or the inductance ΔL, are preserved for subsequent transmission operations. The antenna oscillating circuit 3, 4 is thus adapted to the exciter unit having the oscillator 7. Advantageously, the antenna oscillating circuit 3, 4 is manufactured in such a way that its resonant frequency $f_R$, taking production variations into account, is above the exciter frequency $f_E$ or the desired resonant frequency. The device thus becomes simpler, since only capacitors have to be added.

If the antenna oscillating circuit 3, 4 is only slightly capacitively mistuned, then the resonant frequency $f_R$ can be varied by subtracting a capacitance ΔC. Conversely, if the antenna oscillating circuit 3, 4 is slightly inductively mistuned, then the resonant frequency $f_R$ can be varied by adding a capacitance ΔC.

Next, a change in the current I through the antenna 3 will be considered. If the antenna oscillating circuit 3, 4 is mistuned, and at the exciter frequency $f_E$ only a current with the amplitude $I_2$ flows through the antenna, then the exciter current can also be increased enough that the amplitude of the current through the antennas becomes approximately equal to the amplitude $I_1$. (the resonance curve shown in dotted lines in FIG. 2).

To that end, first the current $I_2$ is measured. Since the amplitude $I_1$ of the ideal current is known, it is possible to determine the correction value by which the current $I_2$ must be amplified. In this procedure, an amplitude $I_3$ of the maximum current through the antenna 3 would increase if the antenna were excited with an exciter frequency $f_E$ equal to the frequency $f_2$. Since the current is increased, accordingly more energy must be supplied to the device. In other words, the exciter current must be increased considerably.

Increasing the exciter current as a function of the correction value is carried out only once and for all after the manufacture of the transceiver 1. These corrections are preserved for subsequent transmission operations. In other words, in all later transmissions of data or energy, the exciter current determined by the correction value remains constant. This has the advantage of ensuring that a constant magnetic field is generated. Thus sufficient voltage is generated in the transponder oscillating circuit 5, 6 in order to conversely transmit data back from the transponder 2 to the transceiver 1.

The correction value can be stored in memory and can affect the exciter current, or the addition or subtraction of the capacitance ΔC and/or the inductance ΔL, upon each transmission operation.

In the device of the invention, it is also possible for both corrections to be performed in succession. In other words, first varying the resonant frequency $f_R$ and then varying the current I by correcting the exciter current. This may be the case if varying the resonant frequency $f_R$ still fails to produce a good approximation to the desired resonant frequency.

Figure 3:
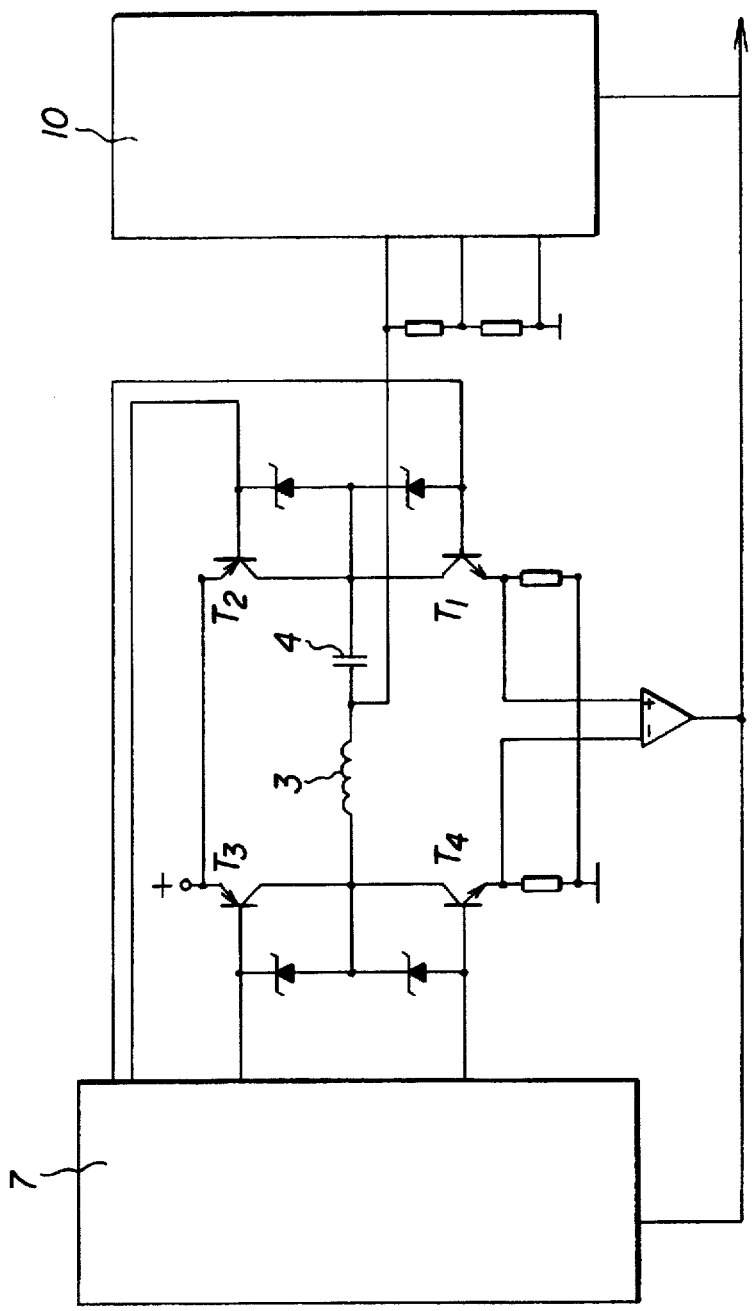
FIG. 3 is a schematic and block circuit diagram of a transceiver of the device of FIG. 1.

FIG. 3 shows a circuit diagram of the device of the invention. The antenna 3 is triggered through a bridge circuit having branches, in each of which there is one switching transistor $T_1$–$T_4$. The transistors $T_1$–$T_4$ are turned on or off in pairs, that is a pair $T_1$ and $T_3$, and a pair $T_2$ and $T_4$. The transistors $T_1$–$T_4$ are triggered during this time at the exciter frequency $f_E$ in such a way that a positive and a negative voltage is applied in alternation to the antenna 3. As a result, a sinusoidal current with a frequency f equal to the exciter frequency $f_E$ flows through the antenna 3.

A pickup point which is located between the antenna 3 and the capacitor 4 is connected to the measuring device 10 for measuring the current I and voltage U. Both the amplitude and the phase of the current I and voltage U can be measured with the measuring device 10. The measured values are compared with desired values on which the construction of the device has been based and which are stored in memory in the measuring device 10. Upon a deviation beyond a predetermined tolerance width, the correction value is generated and stored in memory.

Each of the transistors $T_1$–$T_4$ may include a plurality of parallel-connected single transistors, with the single transistors being turned off depending on the correction value. For instance, the single transistors can be connected directly to the individual memory cells of a non-illustrated memory in which the correction value is stored as a binary word. The correction value then determines the number of single transistors that are connected parallel to one another and are triggered in accordance with the correction value. The memory may be contained in the oscillator 7, by way of which the antenna 3 is triggered in accordance with the correction value. In that case, the oscillator 7 acts like a current driver stage of the antenna 3.

The transistors $T_1$–$T_4$ in the bridge circuit may also be triggered by a pulse-width-modulated signal through the oscillator 7. The pairs of transistors $T_1$ and $T_3$, and $T_2$ and $T_4$, are turned on and off for variably long times depending on the length of the turn-on pulse and an ensuing variable pulse interval (the lengths of the pulse and the interval depend on the correction value). Thus the current I through the antenna 3 can be controlled as a function of the correction value.

Triggering with a pulse-width-modulated signal has the advantage of permitting an amplitude-modulated signal to be transmitted to the transponder 2 at the same time.

However, the exciter current and therefore the current I through the antenna 3 is only varied as a function of the correction value within a predetermined tolerance width. If a greater variation were necessary, then it could be concluded that the corresponding transceiver 1 has excessive errors and will consequently be rejected.

In the device according to the invention, the correction value is first defined once and for all at the band end after the manufacture of the transceiver 1. In all subsequent transmission operations, the correction value is already taken into account, so that the efficiency of the transmission is high, in other words so that the received amplitudes of the transmitted signals will be high enough. The correction value can be determined in the device of the invention whenever the transponder 2 is located in the vicinity of the transceiver 1. However, the transponder oscillating circuit 5, 6 has only a slight effect on the resonant frequency $f_R$ of the antenna oscillating circuit 3, 4 and on the current I through the antenna 3, since its coil 5 and capacitor 6 have only slight impedance values, because of the small dimensions of the transponder 2. For this reason, the resonant frequency $f_R$ of the antenna oscillating circuit 3, 4 and the current I through the antenna 3 can be ascertained even without the transponder 2.

The desired values for the resonant frequency $f_R$ and the current $I_1$ may be ascertained beforehand from a laboratory sample. However, the desired values may also be calculated from a model.

Advantageously, a device according to the invention is used in an anti-theft system for a motor vehicle. In it, energy is transmitted from the transceiver 1 to the transponder 2, which uses this energy in order to transmit encoded data back from the transponder 2 to the transceiver 1. The oscillation of the transponder oscillating circuit 5, 6 is advantageously load-modulated or frequency-modulated at the rhythm of the code information. Due to the inductive coupling, the oscillation of the antenna oscillating circuit 3, 4 is modulated as well.

The modulated oscillation of the antenna oscillating circuit 3, 4 is detected either by the measuring device 10 or by a non-illustrated evaluation unit. A demodulator demodulates the code information from the modulated oscillation and carries it on to a comparator. The comparator compares the detected code information with desired code information, and if they agree outputs a release signal to a security device. Such a security device may, for instance, be an immobilizer or a door lock.

The transceiver 1 may be disposed in a door or ignition lock, while the transponder 2 is accommodated on an ignition key or a chip card.

The measuring device 10 may be a microprocessor, which detects the current through an A/D converter and takes on the task of adding the capacitance ΔC and/or the inductance ΔL or controlling the exciter current. Other functions, such as demodulation and comparison of variables, can also be taken over by the microprocessor.

Instead of the amplitude of the current, the amplitude of the voltage at the antenna 3 can also be measured. In order to measure the phase angle φ and the capacitive or inductive mistuning of the antenna oscillating circuit, the phase of both the voltage and the current through the antenna 3 is measured. Such measurements are adequately well-known. They therefore need not be discussed in further detail herein.

The capacitive and/or inductive network 11, by which the capacitance ΔC or inductance ΔL is added to or subtracted from the antenna oscillating circuit 3, 4 in the form of a parallel or serial impedance, includes various impedances, such as capacitors and oils. The magnitude of the impedance that varies the antenna oscillating circuit 3, 4 depends on the mistuning of the antenna oscillating circuit 3, 4 and therefore on the resonant frequency $f_R$ and the exciter frequency $f_E$.

I claim:

1. A device for transmitting data or energy supply from or to a transponder, comprising:

a stationary transceiver including a first oscillating circuit having an antenna in the form of a first coil, a first capacitor, and a resonant frequency determined by said antenna and said first capacitor;

a portable transponder including a second oscillating circuit having a second coil and a second capacitor;

an exciter unit oscillating at an oscillator frequency and supplying an output variable used as an exciter variable with an exciter frequency for compelling an oscillation of said first oscillating circuit; and an evaluation unit for measuring at least one of current and voltage in said first oscillating circuit, said evaluation unit generating a correction value upon a deviation of the current or the voltage from a desired value and then correcting said first oscillating circuit upon all transmissions between said transceiver and said transponder for causing the most effective possible transmission between said transceiver and said transponder to take place.

2. The device according to claim 1, wherein at least one of the current and the voltage in said first oscillating circuit is measured in accordance with amount and phase, and the correction value is ascertained as a function thereof.

3. The device according to claim 2, wherein the resonant frequency of said first oscillating circuit is varied as a function of the correction value by adding or subtracting at least one serial or parallel inductance and/or at least one serial or parallel capacitance, to or from said antenna or said first capacitor.

4. The device according to claim 2, wherein:

said exciter unit has a driver stage controlled as a function of the correction value, for increasing or decreasing the current in said first oscillating circuit;

said exciter unit has a memory for storing the correction value; and said memory is connected to said driver stage.

5. The device according to claim 4, wherein the current in said first oscillating circuit is varied by the correction value only within a predetermined tolerance width.

6. The device according to claim 1, wherein said first oscillating circuit is connected to said second oscillating circuit through said antenna and said second coil, if said transponder is located in the vicinity of said transceiver.

7. The device according to claim 6, wherein:

said transponder has code information generating a modulated oscillation of said first oscillating circuit as a consequence of an inductive coupling;

said evaluation unit detects the modulated oscillation;

the code information is demodulated from the modulated oscillation;

the detected code information is compared with desired code information; and a release signal for releasing a security device is generated if the detected code information and the desired code information agree.

8. The device according to claim 1, wherein said transceiver is one part of an anti-theft system and is located in a motor vehicle, and said transponder is another part of said anti-theft system and is portable.

* * * * *

UNITED STATES PATENT AND TRADEMARK OFFICE
CERTIFICATE OF CORRECTION

PATENT NO. : 5,796,180
DATED : August 18, 1998
INVENTOR(S) : Manfred Glehr

It is certified that error appears in the above-identified patent and that said Letters Patent is hereby corrected as shown below:

On the title page,

Item [30] should be inserted as follows:

Jan. 23, 1996 [DE]     Germany ..... 196 02 316.5

Signed and Sealed this

Thirtieth Day of March, 1999

Attest:

Q. TODD DICKINSON

Attesting Officer

Acting Commissioner of Patents and Trademarks